United States Patent
Lifton et al.

(10) Patent No.: US 7,573,723 B2
(45) Date of Patent: Aug. 11, 2009

(54) METHOD FOR ATTACHING CHIPS IN A FLIP-CHIP ARRANGEMENT

(75) Inventors: Victor Alexander Lifton, Bridgewater, NJ (US); Victor Manuel Lubecke, Honolulu, HI (US); Flavio Pardo, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 759 days.

(21) Appl. No.: 10/371,258

(22) Filed: Feb. 21, 2003

(65) Prior Publication Data

US 2004/0165363 A1    Aug. 26, 2004

(51) Int. Cl.
  *H05K 7/10* (2006.01)
  *H05K 7/12* (2006.01)
(52) U.S. Cl. .................. 361/770; 361/790; 361/804
(58) Field of Classification Search ......... 524/365–367; 361/790, 808; 174/260–264
See application file for complete search history.

(56) References Cited

U.S. PATENT DOCUMENTS

| | | | | |
|---|---|---|---|---|
| 4,923,421 A | * | 5/1990 | Brodie et al. | 445/24 |
| 5,334,804 A | * | 8/1994 | Love et al. | 174/267 |
| 5,453,652 A | * | 9/1995 | Eda et al. | 310/313 R |
| 5,555,114 A | * | 9/1996 | Narita et al. | 349/98 |
| 5,643,986 A | * | 7/1997 | Ishikawa et al. | 524/366 |
| 5,684,677 A | * | 11/1997 | Uchida et al. | 361/770 |
| 6,153,973 A | * | 11/2000 | Shibata et al. | 313/495 |
| 6,218,629 B1 | * | 4/2001 | Brofman et al. | 174/260 |
| 6,340,846 B1 | * | 1/2002 | LoBianco et al. | 257/783 |
| 6,569,709 B2 | * | 5/2003 | Derderian | 438/109 |
| 6,621,155 B1 | * | 9/2003 | Perino et al. | 257/686 |

* cited by examiner

*Primary Examiner*—Tuan T Dinh
(74) *Attorney, Agent, or Firm*—Eguene J. Rosenthal

(57) ABSTRACT

Polyimide is used as a spacer that also bonds together the elements that it is spacing apart. This is achieved by constructing the spacer on at least one of the wafers as is conventionally done, except that prior to performing the final curing of the polyimide precursor to form the final polyimide, the elements are aligned in a bonder and placed in contact with a pressure of 40 grams per square millimeter at a temperature slightly higher than the soft-bake temperature, as specified by the manufacturer of the polyimide precursor, for few minutes to promote tackiness. This holds the elements together, and the combined structure is then baked to fully cure the polyimide precursor into polyimide and complete the bonding.

10 Claims, 2 Drawing Sheets

METHOD FOR ATTACHING CHIPS IN A FLIP-CHIP ARRANGEMENT

TECHNICAL FIELD

This invention relates to the art of flip-chips, which are two separate chips bonded together, and more particularly, to a method for connecting the chips that are connected together in a flip-chip arrangement using a spacer between the chips.

BACKGROUND OF THE INVENTION

Flip-chip assemblies are formed by combining two separate chips. Usually one of the chips contains spacers that offset the facing surfaces of each of the chips. Micro-electromechanical systems (MEMS) devices for optical applications typically require the fabrication of arrays of micro-mirrors that are tilted using electrostatic control using a set of electrodes located beneath, and/or adjacent to, the micro-mirror. The gap between the mirror and the electrodes is a crucial characteristic of the MEMS device because it determines, among other things, the maximum achievable tilt angle. This is because, if the plate of the micro-mirror is located too close to the substrate on which the electrodes are mounted with respect to the size of the mirror plate, the plate will impact on the substrate, thus limiting the range of tilt.

In the following descriptions, the term "wafer" and the term "chip" may be used interchangeably, assuming there is only one chip per wafer. If there is more than one chip per wafer, than then the term "chip" refers to a smaller unit that is separated from the wafer by a dicing operation. Such dicing operation may be performed prior to, or after, formation of the flip-chip assembly.

In the prior art, a flip-chip arrangement is not required for small gaps. Instead, in a single wafer, a so-called "sacrificial" film is formed where the gap is ultimately desired, and the sacrificial film is etched away during manufacturing to release the mirror plate. This approach is only practical for thin sacrificial films, e.g., on the order of few microns, because mechanical stress develops in thicker sacrificial films, causing destruction of the device, This approach is thus of limited use when large gaps are required, e.g., for larger micro-mirrors with larger angular tilt range requirements.

To achieve larger gaps, the most common technique is to employ a flip-chip arrangement. Typically, the moving portion of the device is formed on one wafer, while the electrodes are formed on another. The wafer on which the moving portion is formed is typically a silicon on insulator (SOI) type of wafer. An exemplary SOI wafer is made of three layers. The first layer is a so-called "handle" wafer layer, which is silicon. The second layer, a buried oxide layer (BOX) which is also known as the "sacrificial layer", is an insulator. The third layer, the "mechanical" layer, is also silicon, although it a) is typically much thinner than handle wafer layer and b) may be referred to as the device layer. The wafer on which the moving portion is formed is etched to remove portions of its handle wafer and its BOX layer so as to free the moving structure. The remaining portion of the handle wafer is then anodically, i.e., field assisted, or fusion bonded to the electrode containing wafer, with the result being that the thickness of the handle wafer defines the gap between the electrodes and the moving portion. However, this approach limits considerably the available materials and process sequences that may be employed.

For example, for anodic bonding at least one material must be insulating and the thermal expansion coefficients of the two materials must be nearly the same. Suitable such materials are silicon and silicon oxide. The surfaces of the two materials should also be clean and polished smooth. To achieve the anodic bond a relatively large voltage is applied across the two pieces to be bonded at an elevated temperature, e.g., between 300° C. and 450° C. Because of the necessity of high temperature, unwanted reactions may result with any metalized section of the device being formed, and so anodic bonding is not especially suitable to forming MEMS devices such as micro-mirrors.

Alternatively, fusion, i.e., direct, bonding does not require applied voltages or that either material be an insulator. Bonding is achieved primarily through chemical reactions between materials on the two surfaces. The two chips are mated together at room temperature and then annealed at high temperatures, e.g., on the order of 1100° C. for silicon, to increase the bond strength.

In order to survive either anodic or fusion bonding, the moving parts of the device being assembled have to be freed only after the bonding is completed. This requires that both chips be compatible with the etchant used to release the moving parts. Furthermore, since the thickness of one of the chips is determinative of the final gap, use of these bonding techniques limits the gap sizes to relatively large gaps, e.g., larger than 200 microns, because the flip-chip wafers must be at least that thick in order to handle them through the various process steps without breaking them.

Polyimides (PI) are a polymerized organic polymer which has been used in various prior art applications, e.g., to provide a protective coating for integrated circuits or as a thick dielectric. Various polyimide compound formulations are available, where various additives are combined with the polyimide to provide an overall material with particular prescribed characteristics. Use of polyimide as a spacer is taught in the prior art. For example, U.S. Pat. No. 4,923,421 teaches the use of fully baked polyimide as a spacer between the display face and the cathode surface of a flat panel display. However, in the prior art the polyimide functions only as a spacer. Other techniques are employed to keep the spaced apart elements together, e.g., in U.S. Pat. No. 4,923,421 the display face and the cathode surface are sandwiched together and sealed to form the final display.

SUMMARY OF THE INVENTION

We have recognized that not only can polyimide be used as a spacer, it can also be used to bond together the elements that it is spacing apart, e.g., the various wafers that are assembled together to form a flip-chip. This is achieved by constructing the spacer on at least one of the wafers as is typically done in the prior art, except that prior to performing the final curing of the polyimide precursor to form the final polyimide, in accordance with the principles of the invention, the flip-chips are aligned in a flip-chip or wafer bonder and placed in contact under pressure at a temperature slightly higher than the soft-bake temperature as specified by the polyimide manufacturer of the polyimide precursor for few minutes to promote tackiness. A useful temperature slightly higher than the soft-bake temperature, when the soft-bake temperature is, for example, 100° C., has been found to be about e.g., 120° C., and a useful contact pressure has been found to be 40 grams per square millimeter. This holds the flip-chips together, and the combined structure is then baked to fully cure the polyimide precursor into polyimide and complete the bonding of the flip-chips to the polyimide.

Advantageously, the maximum temperature of the bonding process need be no higher than the temperature needed to achieve the final curing of the polyimide, e.g., 200° C., which is considerably lower than the temperatures required for prior art flip-chip bonding procedures. Further advantageously, the moving parts may be released before or after the flip-chips are bonded together, thus allowing the processes employed for each chip to be independently optimized.

Polyimide spacers may be made to achieve gap heights ranging from about 5 microns to about 200 microns. To achieve such gap heights the "top" chip is typically assembled with its handle "up". If the "top" chip is mounted handle "down" the gap will be the height of the polyimide spacers plus the thickness of the wafer of the "top" chip.

Note that polyimide spacers can be made on each wafer, and the spacers on each wafer aligned and bonded to create combined spacers, thus doubling the maximum spacing achievable with a polyimide spacer on only one of the wafers.

DETAILED DESCRIPTION

Figure 1:
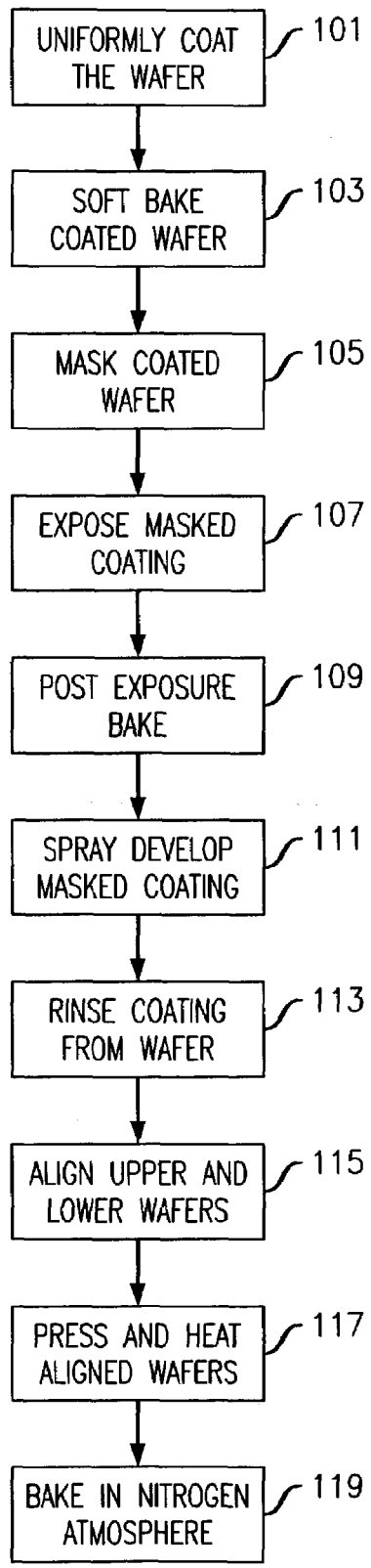
FIG. 1 shows an exemplary process, in accordance with the principles of the invention, by which polyimide is used both as a spacer as well as being used simultaneously as a bonding agent to hold together the elements that it is spacing apart.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Software modules, or simply modules which are implied to be software, may be represented herein as any combination of flowchart elements or other elements indicating performance of process steps and/or textual description. Such modules may be executed by hardware which is expressly or implicitly shown.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

FIG. 1 shows an exemplary process, in accordance with the principles of the invention, by which polyimide is used both as a spacer as well as being used simultaneously as a bonding agent to hold together the elements that it is spacing apart. This is achieved by constructing the spacer on at least one of the wafers as is typically done in the prior art, except that prior to performing the final curing of the polyimide precursor to form the final polyimide, in accordance with the principles of the invention, the flip-chips are aligned in a flip-chip or wafer bonder and placed in contact under pressure at a temperature slightly higher than the soft-bake temperature as specified by the polyimide manufacturer of the polyimide precursor for few minutes to promote tackiness. A useful temperature slightly higher than the soft-bake temperature, when the soft-bake temperature is, for example, 100° C., has been found to be about e.g., 120° C., and a useful contact pressure has been found to be 40 grams per square millimeter. This holds the flip-chips together, and the combined structure is then baked to fully cure the polyimide precursor into polyimide and complete the bonding of the flip-chips to the polyimide.

For pedagogical purposes, it will be assumed, for the initial exposition, that the wafer is sized to be used in only a single device.

The process of FIG. 1 is entered when it is desired to construct a polyimide spacer that also bonds together the elements being spaced apart. In step 101 a uniform coating of polyimide precursor, e.g., Arch Chemical's Durimide® 7520, is placed on a wafer. This may be achieved by well known coating methods such as a spinning operation or by extrusion coating. Uniformly applying the precursor assures that the spacers when formed will have a uniform height.

For spinning, the precursor is placed onto the wafer after the wafer is set up on a chuck or the like for spinning. The precise amount poured may be controlled by using a repeater pipette, such as the Eppendorf® repeater pipette. When using Arch Chemical's Durimide® 7520, which has a high viscosity, the precursor is poured out at the center of the wafer while the wafer is spinning at 250 RPM. The speed is then increased to the final speed for a sufficiently long time to provide the desired coating thickness. For example, the substrate is spun at 755 RPM for approximately 45 seconds. The viscous precursor formulation will form a uniform coating layer on the wafer having a thickness of about 80 microns.

For extrusion coating, a FAS Technologies MicroE™ extrusion coating system is employed. Using, for example, a pump speed of 200 microliters/second and a head speed of 6 mm/s, a thickness of 80 microns may be achieved.

It should be noted that the spacers could be formed on either of the parts to be bonded.

In step 103, the wafer is softbaked, also known as prebaked. The softbaking is done starting at room temperature and using a gradual increasing temperature ramp of about 2 degrees per minute up to a temperature of 100° C. to keep the surface smooth and suitable for bonding. Once the 100° C. temperature is reached, the softbaking continues for about 20 minutes. The purpose of this softbaking is to remove much of the organic solvents from the precursor.

In step 105, a lithographic mask patterned with the desired spacer pattern is aligned with the wafer. It is important that the mask be properly aligned to assure that the final spacers will be located correctly. It should be noted that the technology for accurate masking is quite well developed relative to the formation of integrated circuits, and it is easy with available equipment to obtain the accurate alignment which is necessary when integrated circuit techniques are being used to form the spacers. After the mask is appropriately aligned with the wafer substrate, the wafer is exposed for development, in step 107, by being subjected to broadband radiation in the ultraviolet frequency range, e.g., a dose of about 400 mJ/cm$^2$.

In step 109, the wafer is then subject to a post-exposure bake by heating the wafer again at a temperature of approximately 100° C. for about 5 minutes.

In step 111 the wafer is then loaded into a spray developer and sprayed using an atomizing spray nozzle, with an appropriate developer material, such as the QZ3501 developer available from the previously mentioned Arch Chemicals, until one can visually see the development. The portion of the coating which was not exposed to the UV light, because it was blocked by the pattern on the mask, is then removed from the wafer in step 113 by rinsing it with an appropriate rinse solution, such as QZ3501 rinse solution also available from Arch Chemicals. Thus all that is left are only those portions that form the desired spacers.

In step 115, the wafer—which for purposes of identification will be considered the "lower" wafer—is placed in a bonder, e.g., a flip-chip or wafer bonder. In accordance with an aspect of the invention, the wafer is then aligned and placed in contact with a second wafer—which for purposes of identification will be considered the "upper" wafer—in the arrangement necessary to form the desired flip-chip device.

In step 117, the contacted wafers are then pressed together, e.g., with a pressure of 40 grams per square millimeter, at a temperature slightly higher than the soft-bake temperature as specified by the manufacturer of the polyimide precursor for a few minutes, e.g., five minutes, to promote tackiness, in accordance with the principles of the invention. Since the soft-bake temperature specified by Arch Chemicals for its polyimide precursor is 100° C., one temperature successfully employed is 120° C. Upon conclusion of this step, the two wafers will stick together, although the bond between the polyimide precursor and its opposite wafer will not yet have its full strength, which is only achieved after hard bake curing, which is performed in step 119.

Note that, in accordance with an aspect of the invention, only the point of contact of the spacer and the corresponding bonding point on the opposite wafer need be so heated.

The manufacturer's recommended hard bake curing process for Arch Chemical's Durimide® 7520 is to heat the precursor at 350° C. for one hour. Doing so yields a bond shear strength of about 50 kg force for a 1 cm$^2$ chip with polyimide posts covering about one fifth of the total area, in accordance with an aspect of the invention. However, using such a high temperature may not be desirable in various applications. Therefore, in accordance with an aspect of the invention, it has been found that the hard bake curing may instead be performed at 200° C. for three hours while achieving substantially the same final bond strength. Furthermore, it has been found that by raising the temperature the time may be reduced, thus providing a range of temperature and time that may be suitable for various applications.

In order to facilitate curing, it is recommended that the spacers be not too large, e.g., they should be pillars having a diameter less than the height of the spacers. This facilitates the ability of the byproducts of the curing process to easily escape from the precursor as it cures. Note that, multiple spacer pillars could be placed within a single area. However, adequate spacing should be left between them so the byproducts can escape. As an alternative to pillars, thin walls may be employed. The walls may intersect forming chambers, provided there is some escape route for the byproducts, e.g., through gaps in moveable mirrors of a MEMS device.

Note also that spacers may be formed on both the upper and lower wafers. However, care must be taken that the heights of the spacers and wafer features are such that good contact is made between points to be bonded.

Figure 2:
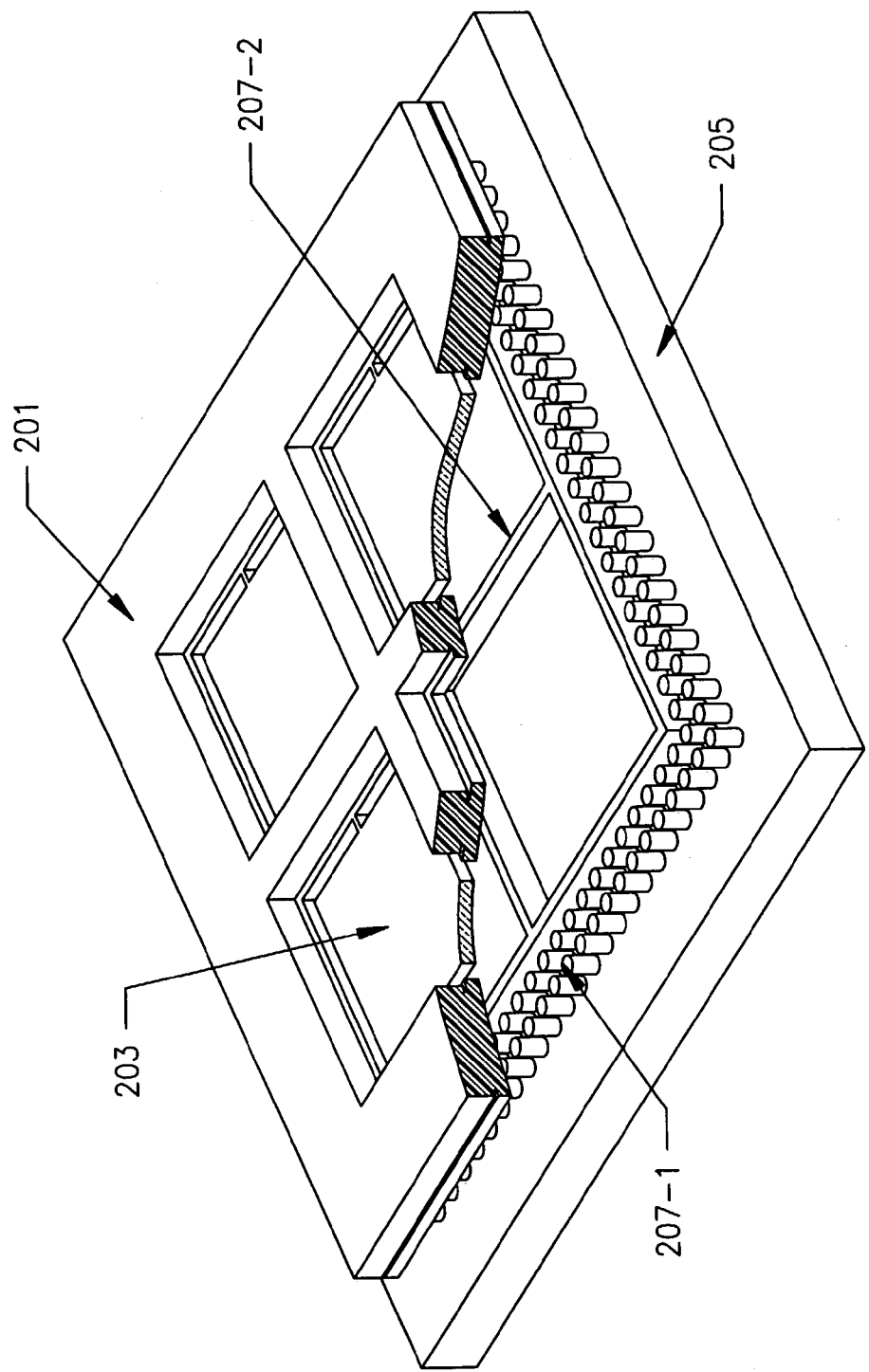
FIG. 2 shows a flip-chip assembly in which a first chip and a second chip are bonded together via polyimide spacers, in accordance with the principles of the invention.

FIG. 2 shows an exemplary flip-chip assembly in which first chip 201, e.g., an SOI chip containing movable MEMS micromirrors 203, and second chip 205, e.g., a chip containing electrodes for controlling the positions of MEMS micromirrors 203, are bonded together via polyimide spacers 207, in accordance with the principles of the invention. Polyimide spacers 207 may include polyimide pillar spacers 207-1, polyimide wall spacers 207-2, and/or any other type of polyimide spacer appropriate for the application.

What is claimed is:

1. A method for use bonding a first chip and a second chip to form a flip-chip assembly, the method comprising the step of:
    forming at least one polyimide precursor spacer on said first chip;
    bringing said at least one polyimide precursor spacer on said first chip into contact at a prescribed pressure with a structure of said second chip without any substance intervening between said at least one polyimide precursor spacer and said structure of said second chip; and
    heating at least the point of contact of said at least one polyimide precursor spacer to promote tackiness of said at least one polyimide precursor spacer, whereby said spacer sticks to said structure of said second chip because of said tackiness of said at least one polyimide precursor spacer.

2. The invention as defined in claim 1 wherein, in said heating step, said point of contact of said at least one polyimide precursor spacer is heated to at least a temperature slightly higher than the soft-bake temperature of polyimide.

3. The invention as defined in claim 1 further comprising the step of heating said polyimide precursor spacer to cure it into a polyimide spacer.

4. The invention as defined in claim 1 wherein said prescribed pressure is about 40 grams per square millimeter.

5. The invention as defined in claim 1 said forming step further comprises the step of soft-baking said polyimide precursor spacer, wherein said soft-baking is performed by gradually heating said polyimide precursor spacer to a prescribed soft-baking temperature.

6. The invention as defined in claim 1 wherein said polyimide precursor spacer is formed from Arch Chemical's Durimide® 7520 and further comprising the step of curing said polyimide precursor spacer at a temperature below 350° C.

7. The invention as defined in claim 1 wherein polyimide precursor material that is employed to form said polyimide precursor spacer has a curing temperature specified by a manufacturer of said polyimide precursor material from which said polyimide precursor spacer is formed, said method further comprising the step of curing said polyimide precursor spacer at a temperature substantially below said manufacturer specified curing temperature.

8. The invention as defined in claim 1 wherein a plurality of said polyimide spacers are formed, each having sufficient space between itself and any adjacent spacer to enable polyimide byproducts to escape from each of said polyimide precursor spacers when said polyimide precursor spacers are cured.

9. The invention as defined in claim 2 wherein said temperature slightly higher than the soft-bake temperature of polyimide is about 120° C.

10. A method for use bonding a first chip and a second chip to form a flip-chip assembly, the method comprising the step of:

forming at least one polyimide precursor spacer on said first chip;

bringing said at least one polyimide precursor spacer on said first chip into contact at a prescribed pressure with a structure of said second chip without any substance intervening between said at least one polyimide precursor spacer and said structure of said second chip; and heating at least the point of contact of said at least one polyimide precursor spacer to promote tackiness of said at least one polyimide precursor spacer, whereby said spacer sticks to said structure of said second chip because of said tackiness of said at least one polyimide precursor spacer;

wherein said forming step further comprises the step of soft-baking said polyimide precursor spacer, wherein said soft-baking is performed by gradually heating said polyimide precursor spacer to a prescribed soft-baking temperature.

* * * * *

UNITED STATES PATENT AND TRADEMARK OFFICE
CERTIFICATE OF CORRECTION

PATENT NO. : 7,573,723 B2  Page 1 of 1
APPLICATION NO. : 10/371258
DATED : August 11, 2009
INVENTOR(S) : Lifton et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1522 days.

Signed and Sealed this

Seventh Day of September, 2010

David J. Kappos
*Director of the United States Patent and Trademark Office*